United States Patent [19]

Rudelle

[11] Patent Number: 4,695,809
[45] Date of Patent: Sep. 22, 1987

[54] MICROWAVE SWEEP FREQUENCY OSCILLATOR

[75] Inventor: Marie-Irène Rudelle, Aubervilliers, France

[73] Assignee: U.S. Philips Corporation, New York, N.Y.

[21] Appl. No.: 867,349

[22] Filed: May 23, 1986

[30] Foreign Application Priority Data

May 28, 1985 [FR] France ................................ 85 07951

[51] Int. Cl.⁴ ......................... H03B 5/18; H03B 23/00
[52] U.S. Cl. ......................... 331/117 D; 331/117 FE; 331/177 V; 331/178
[58] Field of Search ...................... 331/96, 99, 107 SL, 331/117 D, 117 FE, 177 V, 178; 332/30 V

[56] References Cited

U.S. PATENT DOCUMENTS 4,189,690  2/1980  Bock et al. ................. 331/117 D X
4,310,809  1/1982  Buck et al. ..................... 331/117 D

FOREIGN PATENT DOCUMENTS 866692  10/1981  U.S.S.R. .......................... 331/117 D

Primary Examiner—Siegfried H. Grimm
Attorney, Agent, or Firm—Thomas A. Briody; Jack Oisher; William J. Streeter

[57] ABSTRACT

A microwave frequency oscillator capable of being linearly swept over a wide frequency range around a central frequency comprising a field-effect transistor with a high gain, the output of which is fed back to the input from a coupler consisting of two relatively narrow striplines located close together. A wobbulator circuit is fitted in shunt to the feedback network comprises two voltage variable capacitors in series between three line components designed to optimize the frequency modulation linearity in relation to the voltage variable capacitance diode control voltage. The oscillator is useful in equipment requiring extreme linearity such as radio-altimeter sources.

4 Claims, 6 Drawing Figures

MICROWAVE SWEEP FREQUENCY OSCILLATOR

The invention relates to a microwave frequency power oscillator swept linearly over a wide frequency range around a central frequency by means of two voltage variable capacitance diodes, the capacitance of which may be varied depending on a control voltage. The cathodes of the variable capacitance diodes are interconnected via a line element to which the control voltage is applied. The oscillator comprises a transistor whose matching impedances at its input and output electrodes are provided by lines designed to ensure the maximum gain at the central frequency.

The oscillator of the invention provides a 600 mW output power at a working frequency of some 4 GHz and may be used in equipment such as radio-altimeters or proximity fuses which require an extremely precise linearity in the frequency-control voltage characteristic.

Such linearity may be defined as the ratio between the maximum slope of the characteristic and its minimum slope in the specified frequency-variation field (e.g. 200 MHz around 4 GHz).

Another definition which defines linearity as the frequency difference in relation to a theoretical linear variation is better, but does not take account of the abrupt and considerable variations in slope, which are unacceptable for the above uses.

Calculations have shown that, for a virtually sinusoidal variation about the ideal law, the linearity given by the first definition is at least 4 pi more specific than that given by the second, the one most often found in references.

Microwave frequency oscillators of the type described above are known, for example, from U.S. Pat. No. 4,310,809, which describes a negative resistance device made on the basis of a two-pole transistor, the frequency variation of which is controlled by varactors fitted in parallel in a wobbulator circuit. This type of oscillator, which is in common use in the microwave frequency field, supplies a relatively low output power of 10 mW at 8.5 GHz in this instance. Moreover, the linearity obtained in frequency variation, based solely on the hyperabrupt characteristics of the varactors, does not meet the extremely precise conditions set out above.

The purpose of the invention is to use a high-gain microwave frequency transistor to provide an oscillator of the feedback amplifier type supplying a high power and with an extremely linear frequency variation characteristic in relation to the applied voltage.

The oscillator of the invention is noteworthy in that the working frequency is obtained with a stable transistor operating mode in said frequency range by means of a feedback network matching its input to its output, variable-capacitance diodes being inserted in series between three line elements in a wobbulator circuit arranged in shunt to the feedback circuit, a line element interconnecting the cathodes constituting one of said three line elements. Of the other two line elements, one end of each is connected to a diode anode, and the respective other ends are connected to a point on the feedback network and to earth, said line elements of the wobbulator circuit being designed to optimise the frequency variation linearity.

High-gain microwave frequency transistors are now available. The use in the oscillator of the invention of a field-effect microwave frequency transistor with a gain of some 10 dB makes said feedback possible from a coupler consisting of two fairly narrow lines close together at the oscillator output. Thus a small part of the output power is tapped by radiation and sent to the input via a network comprising the line equivalent to the coupler and complying with the oscillation condition. Transistors with gains of some 3 dB lower require impossibly large couplers.

The way in which the invention can be produced will be better understand from the following description given with reference to the attached drawings, the whole being given by way of example.

Figure 1:
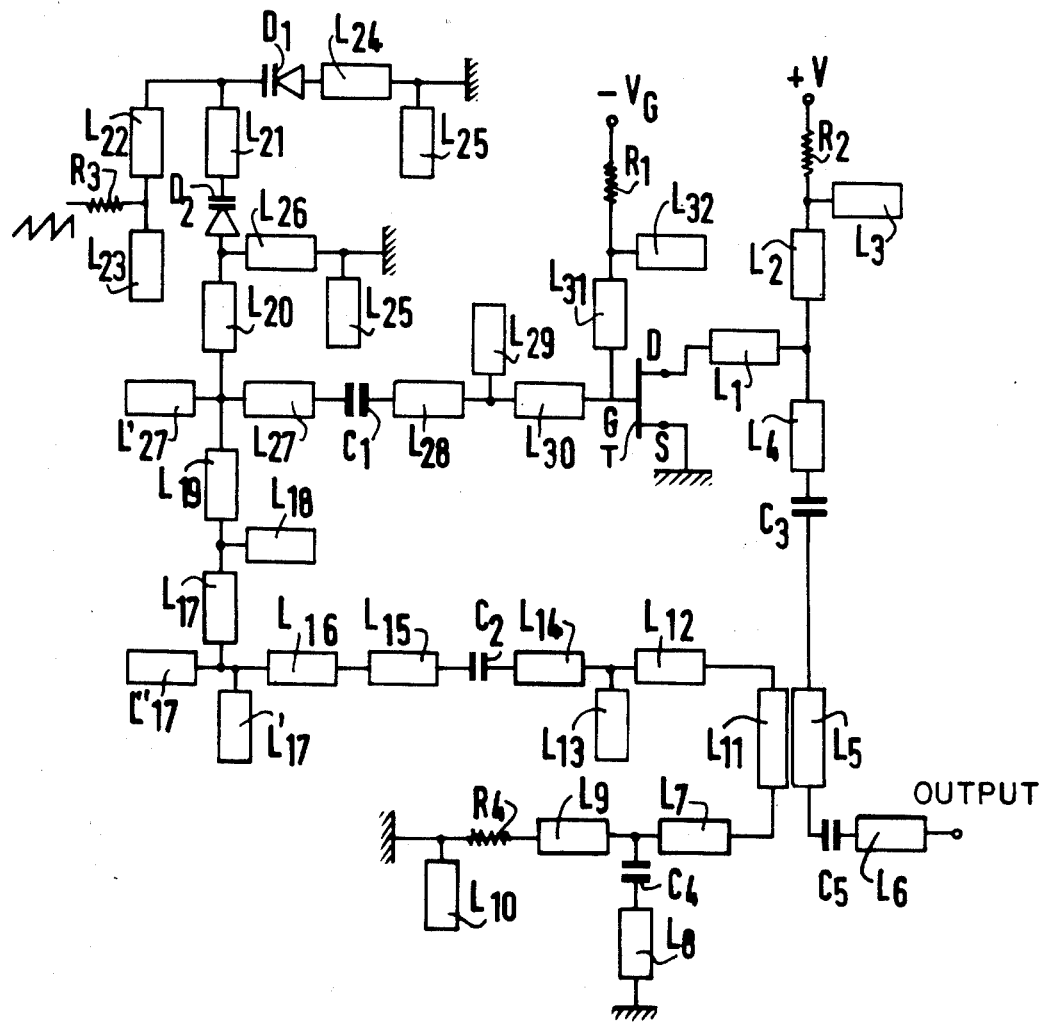
FIG. 1 is a theoretical circuit diagram of the microwave frequency oscillator of the invention.
Figure 2B:
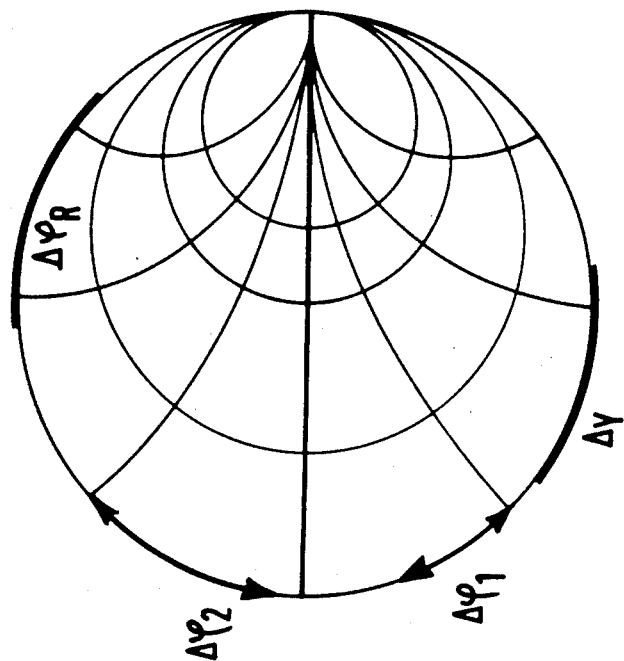
FIG. 2b shows the variation in the phase of the reflection coefficient on a Smith chart.
Figure 2A:
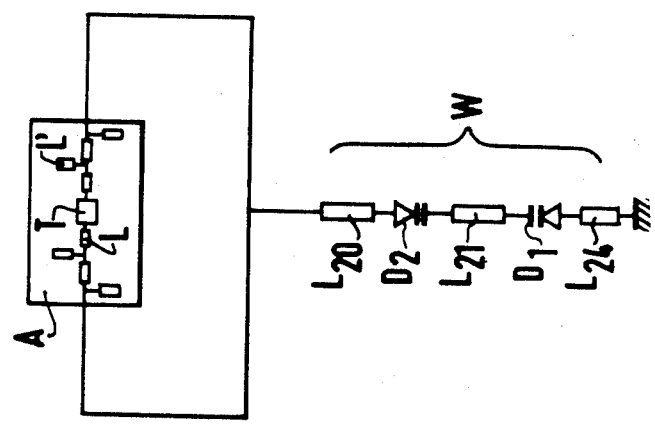
FIG. 2a shows the arrangement of the wobbulator circuit in relation to the feedback network.
Figure 3:
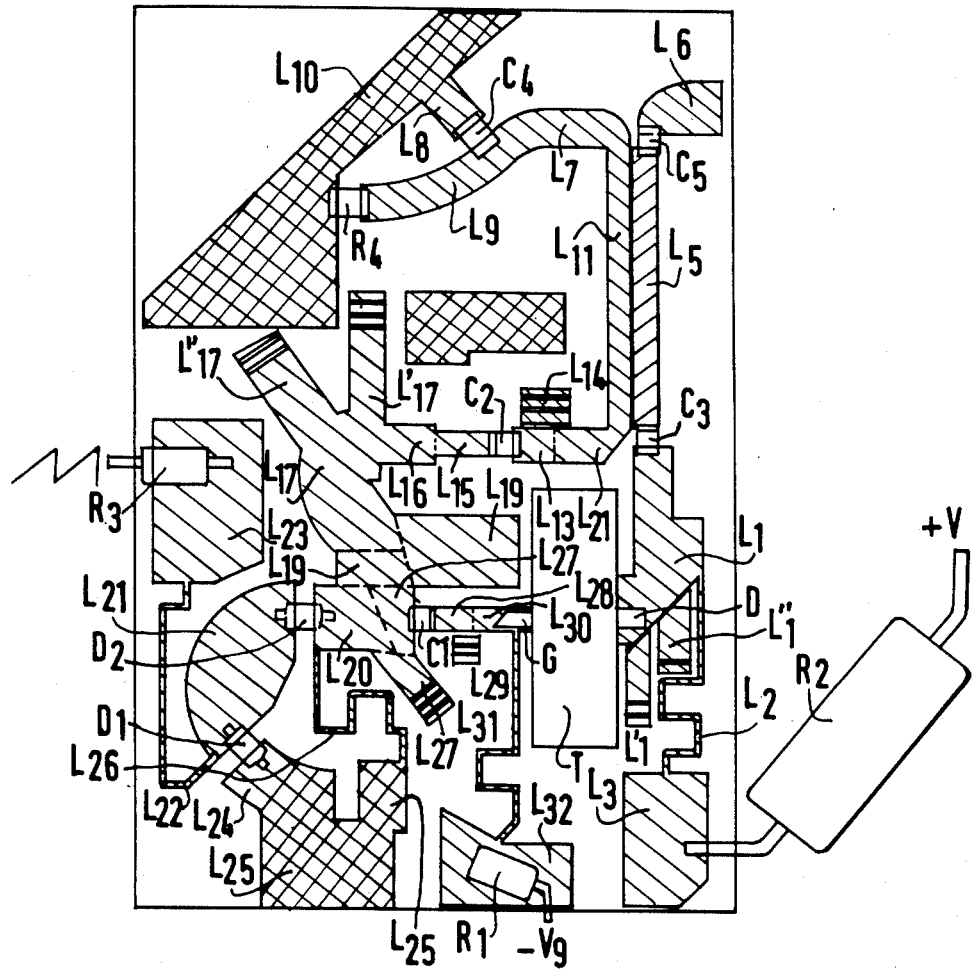
FIG. 3 is an overall view of a "micro-strip" embodiment of the oscillator.

The corresponding components of FIGS. 1, 2a and 3 bear the same reference numerals.

The microwave frequency oscillator of the invention, the diagram of which is shown in FIG. 1, is obtained from a feeback amplifier comprising a field-effect transistor T.

The 50 ohm matching of the input impedance of this transistor is produced by:

the series connection between earth and gate G of the transistor of resistor R4, lines L9, L7, L11, L12, L14, of capacitor C2, lines L15, L16, L17, L19, L27, of capacitor C1, lines L28 and L30;

the series connection of capacitor C4 and line L8 between the point shared by lines L7 and L9 and earth;

lines open at one end ("stubs") L13, (L'17, L"17), L18, L'27 and L29 respectively arranged at the interconnections of lines L12 and L14, L16 and L17, L17 and L19, L19 and L27, L28 and L30.

Likewise, the 50 ohm matching of the output impedance is produced by the series connection of said output and earth of line L6, of capacitor C5, of line L5, of capacitor C3, of lines L4 and L1.

The characteristics of the amplifier thus constituted are given below:

Linville factor less than 1 (the stability condition is thus met);

Maximum gain Gm between gate and drain of some 10 dB;

Maximum output power approaching 1 Watt.

The lengths of the lines and the stubs and also the capacitances of the capacitors of the amplifier circuit are defined so that:

the synthesised source impedances ZS between gate and earth and the synthesised charge impedances ZL between drain and earth ensures that the gain of the amplifier is at its maximum at the central frequency;

the moduli of the input and output reflection coefficients $$1 = \frac{Z1 - Z0}{Z1 + Z0} \text{ and } 2 = \frac{Z2 - Z0}{Z2 + Z0}$$

respectively are high (close to unity) and substantially independent of the frequency in the useful frequency band (where Z1 and Z2 are respectively the input and output impedances and ZO=50 ohms);

the phase of the reflection coefficient Γ1 varies uniformly with the frequency in the useful frequency band;

the phase shift between the input and output voltages is 2 k pi at the central frequency and also varies uniformly with the frequency.

The input and output matching impedances respectively comprise lines L11 and L5 of the same length, which are relatively narrow. Placing them close together constitutes a directive coupler which ensures that the amplifier is fed back on itself. The feedback network thus formed matches the output of the transistor to its input and takes the line equivalent to the coupler back to any point, meeting the oscillation condition.

For matching (effect on the modulus and phase of a reflection coefficient) and for the voltage phase shift between its coupled input and output terminals, the low-coupling (less than or about 10 dB) directive coupler of length 1 and characteristic impedance ZC behaves like a line of length $1 + 3\lambda/4$ and characteristic impedance ZC, where λ is the wavelength corresponding to the oscillation frequency.

The drain is polarised by a d.c. voltage source V of which the negative terminal is earthed and the positive terminal is connected to the interconnection point of lines L1 and L4 via a resistor R2 and a line L2, itself fitted with a stub L3.

The gate is polarised in the same way by a d.c. voltage source $V_G$ of which the positive terminal is earthed and the negative terminal is connected to the gate via a resistor R1 and a line L31, itself fitted with a stub L32.

The wobbulator circuit arranged in shunt to the feedback network consists of two voltage variable capacitance diodes D1 and D2 inserted in series between line components L24, L21 and L20. Central component L21 interconnects the cathodes of the diodes and is supplied, at its end connected to D1, via a resistor R3 and a line L22 fitted with a stub L23, with a variable sawtoothed control voltage signal. One end of line components L20 and L24 is connected to one diode anode, while their other ends are linked respectively to the interconnection of lines L19, L27, L'27 of the input matching circuit and earth.

Lines and stubs L24 and L25 on the one hand and L26 and L25 on the other respectively constitute the earth returns of the anodes of variable capacitance diodes D1 and D2.

The position of this wobbulator circuit of the Smith chart and the length of the three line components are determined according to the invention to obtain the frequency linearity in relation to the control voltage.

The various ways of constructing the wobbulator circuit will now be examined in order to obtain the best possible linearity and to give a brief explanation of the procedure for optimising said linearity from the above circuit.

At two different but neighbouring frequencies, the matching network does not have the same effect on the output impedance: starting from the same point on the Smith chart, it introduces a phase difference $\Delta\phi(\Gamma)$ and a modulus difference $\Delta|\Gamma|$ between the two reflection coefficients. The latter difference is negligible, as the reflection coefficient moduli are of the same order of magnitude and vary little with the frequency. The purpose of the wobbulator circuit is to compensate for the $\Delta\phi(\Gamma)$ produced by the matching network and to vary the voltage phase shift $\phi(V)$, thus making it possible to vary the oscillation frequency.

The reflection coefficients of the input and output impedances of the matched transistor vary little with the frequency. A phase difference of some 4° is noted for both the input and the output reflection coefficients.

The size of the transistor and the presence of the equivalent line to the coupler (for which only the length has a different effect depending on the frequency) dictate a dispersive line length of about λ at the central frequency. With the latter at 4 GHz, the phase shift corresponding to a frequency variation of 200 MHz will be $2 \times 360 \times (0.2/4) = 36°$ (the factor 2 takes account of the 180° periodicity of the Smith chart).

The total phase variation $\Delta\phi(\Gamma)$ to be compensated with the aid of the wobbulator circuit is therefore about 40°.

It will also be noted that a reduced impedance variation $\Delta z$ of one variable capacitance diode has a maximum effect on $\Delta\phi(\Gamma)$ in the short circuit area of the Smith chart.

If the impedance of the variable capacitance diode is 50 ohms at 4 GHz and if a frequency variation of 200 MHz about this frequency introduces an impedance variation of 20 Ohms, the reduced impedance variation $z = \Delta z/z = -j0.4$ brings about a 40° phase difference in the reflection coefficient. It therefore seems perfectly in order simply to compensate the phase of the feedback network by means of a single variable capacitance diode fitted in series in the netork.

With the input-output matching produced by arranging stubs on the lines needed for feeding back in order to change the variation in the reflection coefficient with frequency as little as possible, attention need then be paid only to the phase variation $\Delta\phi(\Gamma)$ of this coefficient, which is linear. The same applies to the variation in the imaginary part of the reduced impedance $\Delta\text{Im}(z)$.

What is desired, therefore, in the area where the variable capacitance diode is to be fitted, is to compensate the linear variations with the frequency of $\phi(\Gamma)$ and Im(z) brought about by the re-looping network by means of a reverse linear variation in $\phi_v(\Gamma)$ and $\text{IM}_v(z)$ of the variable capacitance diode. This means that the characteristic of $\phi_v(\Gamma)$ in relation to $\text{Im}_v(z)$ is linear. Within a linear region of this characteristic obtained experimentally, the variation in the impedance of the variable capacitance diode with frequency should also be linear. The experimental variation shows that it is not, exhibiting considerable non-linearity of some 40%. An examination of this impedance variation with voltage shows, moreover, that the wobbulation slope is steep: 200 MHz for 12.4 V.

Attempts may be made to compensate this non-linearity by fitting the variable capacitance diode at another point on the Smith chart where the phase shift in the reflection coefficient no longer varies linearly with the imaginary part of the reduced impedance. Here, linearity is improved but the phase variation provided by the variable capacitance diode drops: the wobbulation slope, already steep, will have to be increased. Experience has shown that it would have to be almost doubled.

The remedy to this drawback is to fit the variable capacitance diode in parallel to the feedback network.

A maximum variation in the phase of the reflection coefficient and a minimum variation in its modulus, as may be checked by referring to the Smith chart, will be obtained by causing the admittance variation $\Delta y$ of the variable capacitance diode to act in the open circuit region (in impedance). The position of the parallel wobbulator circuit is thus clearly defined in the feedback circuit.

As in the previous instance, where the variable capacitance diode was in series in the feedback network, it is desired to compensate a linear variation with the frequency of the $\Delta\phi(\Gamma)$ provided by the matching network by a reverse linear variation of the $\Delta\phi_\nu(\Gamma)$ provided by the variable capacitance diode. The parallel circuit associated with the variable capacitance diode must therefore cause its admittance variation $\Delta y_\nu$ to act in a region where the non-linearity of the reflection coefficient phase variation curve in relation to the imaginary part of the reduced admittance compensates for the non-linearity of the latter's variation curve in relation to the frequency.

In an initial stage, with a short-circuited stub of length $l_1$, the variable capacitance diode is taken into a position such that its impedance variation gives the greatest possible phase variation $\Delta\phi_\nu(\Gamma)$. Then, using a line of length $l_2$, a virtually linear variation in the returned admittance is obtained.

This circuit comprising a variable capacitance diode in series between two line components makes it possible to linearise the parallel returned admittance curve in relation to the frequency and, unlike the case where the variable capacitance diode is fitted in series in the feedback network, the linearisation brings about no reduction in the slope of the curve; quite the contrary. There are, however, two drawbacks:

with an increased slope of the parallel returned admittance curve against the frequency, the feedback must be extended for the purposes of the transistor input-output matching, thus increasing the bulk;

the point value of the parallel returned impedance is too sensitive to lengths $l_1$ and $l_2$, which may completely alter the matching.

One answer would be to increase the wobbulation slope. However, it is already steep, while the non-linearity to be compensated would be too great.

Another method would be to add a second variable capacitance diode in the parallel wobbulator circuit.

The method of operation of this circuit is shown in FIGS. 2a and 2b. FIG. 2a is a simplified representation of the oscillator of FIG. 1 with microwave frequency amplifier A fed back upon itself and comprising transistor T with its input and output matching impedances consisting of lines L and stubs L', and the wobbulator circuit W of the invention fitted between a point on the feedback network and earth. FIG. 2b shows the successive variations in the phase of the reflection coefficient $\phi(\Gamma)$ entered on the Smith chart.

Using short-circuited line L24 of length $l_1$, the first variable capacitance diode D1 is caused to provide a maximum phase variation $\Delta\phi_1(\Gamma)$. Line L21 of length $l_2$ allows the second variable capacitance diode D2 also to provide a maximum phase variation $\Delta\phi_2(\Gamma)$. The third line L20 of length $l_3$ brings the phase variation at $\Delta\phi_R$ and the impedance of the wobbulator circuit into a region such that the variation $\Delta y$ in the total admittance is virtually linear with the frequency.

The use of two variable capacitance diodes does not increase the nonlinearity to be compensated but increases the useful phase variation.

The slope of the parallel returned admittance variation curve against the frequency is less steep than with a single variable capacitance diode and the point value of y is less sensitive to lengths $l_1$, $l_2$ and $l_3$.

To simplify the argument, only lengths $l_1$, $l_2$ and $l_3$ of the parallel modulation circuit lines are of interest. Their impedances are also significant in the wobbulation efficiency. Deeper examination shows that the impedance of the first line of length $l_1$ will have to be as high as possible to limit the undesirable scatter which it entails, and its length must be appropriately adjusted. The lines of length $l_2$ and $l_3$ will have a higher impedance in order to retain as far as possible the favourable phase variation brought about by the variable capacitance diodes.

As shown here, the modulation circuit has a non-zero average admittance. If the wobbulation is to be placed at a feedback point close to the open-circuit point in order to preserve linearisation, a stub must be added here to centre the admittance variation about zero.

In view of the power running through the oscillator, the variable capacitance diodes may not be used too close to a zero-polarisation voltage on pain of detection: account must be taken of the r.f. voltage at the variable capacitance diode terminals.

In order to be able to use them at low polarisation voltages, i.e. where they are most effective, it is best to place the wobbulator circuit between the coupled output of the coupler and the transistor input, rather than between the transistor output and the coupler.

In addition, the first variable capacitance diode is subjected to a higher r.f. voltage than the second. If, therefore, the variable capacitance diodes are to perform at their best, the two saw-teeth of the variable capacitance diode control signal may be shifted by a constant voltage.

In conclusion, fitting the modulation circuit in parallel is shown to be more effective than series-connection, for both the wobbulation band and linearity.

FIG. 3 shows an embodiment of the oscillator.

Each line on the diagram of FIG. 3 shown cross-hatched in one direction or another consists of a conductive layer of specified length and width silk-screen printed on a surface of an insulating plate. The other surface, in communication with the first via holes drilled in the plate, is covered with a uniform conductive coating constituting the earth. This system is known as "stripline" or "microstrip".

The width of the lines and stubs like L9, L12, L30, L1, L4, L6, L'17 and L''17 belonging to the transistor input and output matching circuits is fairly great in relation to lines like L2, L22, L26 and L31, the length of which is $\lambda/4$ and which have a high impedance in order to provide the power supply to the circuit to earthing. Lines L11 and L5 of the coupler consist of components of the same length, narrow width in relation to said length, and close enough together. The earther circuit areas are cross-hatched in both directions. The low-frequency components such as power supply resistors R1, R2 and R3 are applied by soldering.

Field-effect transistor T is a high-gain (about 10 dB) GaAs transistor with an output power of the order of a Watt.

The overall dimensions of the oscillator are $25 \times 40$ mm.

Figure 4B:
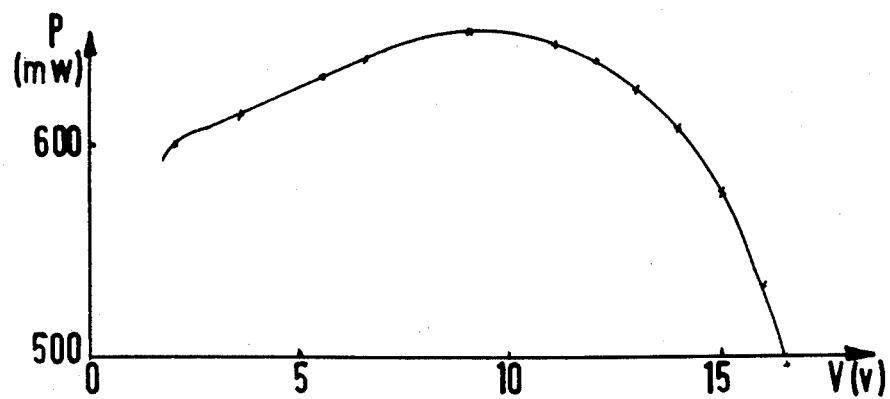
FIG. 4b shows the power supplied by the oscillator in relation to the control voltage.
Figure 4A:
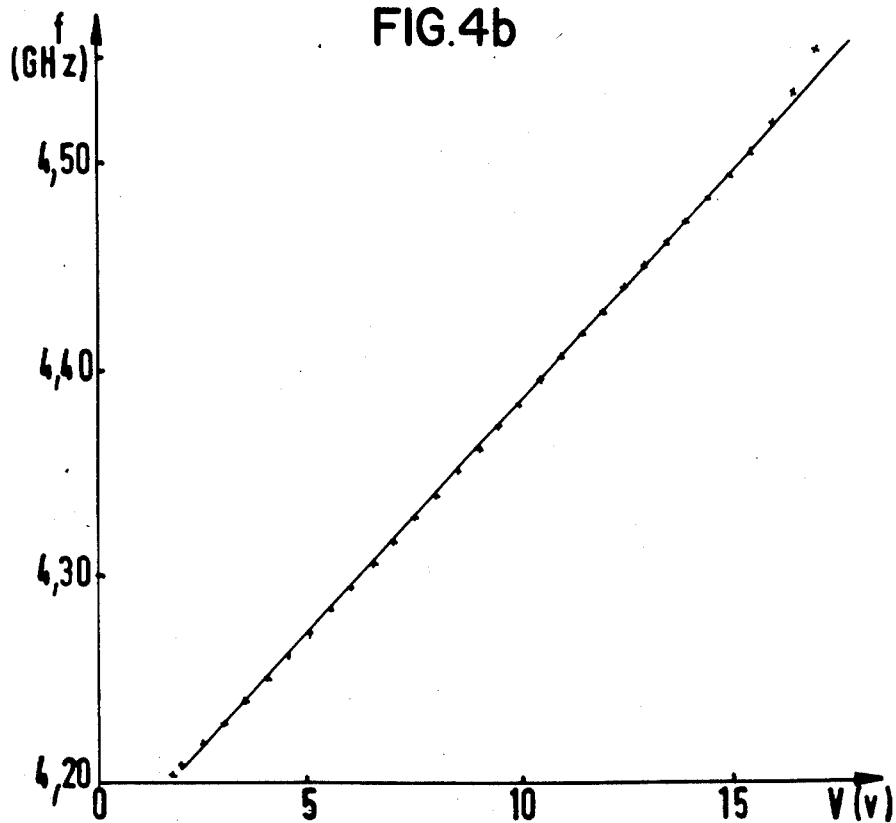
FIG. 4a shows the frequency variations of the oscillator in relation to the control voltage.

FIG. 4a is an experimental characteristic of the output frequency in relation to the variable capacitance diode control voltage.

Around a central frequency of 4.35 GHz obtained for a variable capacitance diode control voltage of 8.5 V, an examination of this characteristic shows a 210 MHz frequency band which is linearly wobbulated within less than 4% and another of 290 MHz which is linearly wobbulated within less than 10%, with the linearity assessed in accordance with its strictest definition as the ratio between the maximum and minimum slopes of the characteristic in the frequency band under consideration.

The computer simulation provides for a maximum band of 400 MHz which is linearly wobbulated within less than 10%. In practice, 200 to 250 MHz seems to be the reasonable attainable limit in view of the lack of precision in calculating the transistor matching and the desired output power with a circuit comprising two variable capacitance diodes.

It is certain that a better oscillator can be obtained by using a larger number of variable capacitance diodes and a transistor with a low output power.

FIG. 4b, which gives the experimental variation in the oscillator output power in relation to the same control voltage shows that the average value of this power is around 600 mW.

What is claimed is

1. A microwave-frequency power oscillator swept linearly over a wide frequency range around a central frequency, by means of two variable capacitance diodes, the capacitance of which may be varied depending on a control voltage, and whose cathodes are interconnected via a line element to which said control voltage is applied, said oscillator comprising a transistor whose matching impedances at its input and output electrodes are provided by lines designed to ensure the maximum gain at the central frequency wherein, the working frequency is obtained with a stable transistor operating mode in said frequency range by means of a feedback network matching its input to its output, said variable capacitance diodes being inserted in series between three line elements in a wobbulator circuit arranged in shunt to said feedback network, said line element interconnecting the cathodes, constituting one of said three elements while of the other two elements one end of each is connected to a diode anode, and the respective other ends are connected to a point on the feedback network and to earth, said line elements of the wobbulator circuit being designed to optimise the frequency modulation linearity.

2. An oscillator as claimed in claim 1, wherein said feedback is provided from a coupler consisting of two lines located near each other at the output of the oscillator, a small part of the power of which is thus tapped by radiation and returned to the input through said feedback network comprising the line equivalent of the coupler and meeting the oscillation condition.

3. An oscillator as claimed in claim 1 wherein said transistor is a field-effect transistor of which the source is earthed and the gate and drain are respectively said input and output electrodes.

4. An oscillator as claimed in claim 2, wherein said transistor is a field-effect transistor of which the source is earthed and the gate and drain are respectively said input and output electrodes.

* * * * *